(12) United States Patent
Ionescu et al.

(10) Patent No.: US 8,862,949 B2
(45) Date of Patent: Oct. 14, 2014

(54) SYSTEMS AND METHODS FOR STORING INFORMATION

(71) Applicant: Infineon Technologies AG, Neubiberg (DE)

(72) Inventors: Mihai-Alexandru Ionescu, Bucharest (RU); Razvan-Catalin Mialtu, Pitești (RU); Radu Mihaescu, Bucharest (RU)

(73) Assignee: Infineon Technologies AG, Neubiberg (DE)

( * ) Notice: Subject to any disclaimer, the term of this patent is extended or adjusted under 35 U.S.C. 154(b) by 142 days.

(21) Appl. No.: 13/651,930

(22) Filed: Oct. 15, 2012

(65) Prior Publication Data

US 2014/0108873 A1    Apr. 17, 2014

(51) Int. Cl.
*G06F 11/00* (2006.01)
(52) U.S. Cl.
USPC ............................................. 714/48; 714/734
(58) Field of Classification Search
CPC ........................................................ G06F 11/07
USPC ....................... 714/48, 23, 30, 31, 32, 34, 734
See application file for complete search history.

(56) References Cited

U.S. PATENT DOCUMENTS

| | | | |
|---|---|---|---|
| 5,721,855 A * | 2/1998 | Hinton et al. | 712/218 |
| 7,289,375 B2 | 10/2007 | Fukui | |
| 2007/0234153 A1* | 10/2007 | Kawasaki | 714/726 |
| 2010/0052424 A1 | 3/2010 | Taylor | |
| 2012/0063524 A1* | 3/2012 | Stott et al. | 375/259 |

OTHER PUBLICATIONS

Infineon Technologies AG, *Sensor Solutions for Automotive and industrial Applications*, © 2012, 40 pages, as available at http://www.infineon.com/dgdl/Sensor+Solutions+for+Automotive+and+Industrial-2012_final.pdf?folderId=db3a30431689f4420II6a096e1db033e&fileId=db3a30433a047ba0013a4f37abc84020.
Infineon Technologies AG, *TLE4997 Programmable Linear Hall Sensor*, Sep. 2008, Version 2.08, as available at http://www.infineon.com/dgdl/TLE4997_Data_Sheet_v2.08.pdf?folderId=db3a30431ce5fb52011d3dd6e8012582&fileId=db3a30431ce5fb52011d3e4c832a2594.

* cited by examiner

*Primary Examiner* — Dieu-Minh Le
(74) *Attorney, Agent, or Firm* — Patterson Thuente Pedersen, P.A.

(57) ABSTRACT

Embodiments relate to reliably storing information in a sensor or other device. In an embodiment, information storage circuitry comprises independent, redundant memory portions and error detection circuitry. The circuit can operate in cooperation with a memory writing procedure that utilizes a validity bit and sequentially writes to one or the other of the redundant memory portions such that at least one of the memory portions has data that is valid and can be recognized as such.

21 Claims, 4 Drawing Sheets

SYSTEMS AND METHODS FOR STORING INFORMATION

TECHNICAL FIELD

The invention relates generally to integrated circuits and more particularly to storing calibration and other information by integrated circuit sensor devices.

BACKGROUND

Sensor devices often need to store information or data internally for use by the sensor at certain times or in the occurrence of certain events. For example, magnetic field sensors often generate and store calibration information for use at start-up or some other time.

This stored information can be lost, however, if the sensor device experiences a reset event or loss of power. Returning to the magnetic field sensor example, these sensors are often used in automotive applications, such as fuel injection and other engine systems, where they can be exposed to significant electromagnetic interference, voltage spikes related to engine starts and stops or other sources, or other power interruptions. These interruptions can cause the supply line voltage to drop below the minimum necessary for the sensor, even for a very brief period of time, causing the sensor to reset and current calibration information to be lost. This is undesirable because a cold start of the sensor requires a calibration procedure, which takes additional time and cannot take into account calibration information obtained during actual operation conditions, which can capture, e.g., temperature and other real-time characteristics which vary from start-up or generally over time.

A related problem is corruption of calibration information. If the sensor is writing to memory when a loss of power or reset occurs, the information may nevertheless be written to memory but that information may be incomplete or corrupted. Even if the sensor is able to maintain the information after the power interruption, such as by using an external capacitor as a source of power, the sensor cannot know that the information is unreliable or uncorrupted. Using that information can lead to reduced performance or errors in the sensor, which are undesirable for obvious reasons.

SUMMARY

Embodiments relate to systems and methods for reliably storing information in a sensor.

In an embodiment, an integrated circuit comprises a first memory portion configured to store information and a validity bit; a second memory portion configured to store information and a validity bit; and circuitry comprising a first error detection circuit coupled to the first memory portion, a second error detection circuit coupled to the second memory portion, and a slow reset circuit coupled to both the first and second memory portions, wherein the first memory portion is reset if an error is detected by the first error detection circuit, the second memory portion is reset if an error is detected by the second error detection circuit, and the first and second memory portions are reset if an error is detected by the slow reset circuit.

In an embodiment, a method comprises setting a validity bit of a first memory portion to a first value; writing data to the first memory portion; setting a validity bit of the first memory portion to a second value; setting a validity bit of a second memory portion to a first value; writing data to the second memory portion; and setting a validity bit of the second memory portion to a second value.

In an embodiment, a device comprises information storage circuitry comprising a first memory portion configured to store information and a validity bit; a second memory portion configured to store information and a validity bit; and circuitry comprising a first error detection circuit coupled to the first memory portion, a second error detection circuit coupled to the second memory portion, and a slow reset circuit coupled to both the first and second memory portions, wherein the first memory portion is reset if an error is detected by the first error detection circuit, the second memory portion is reset if an error is detected by the second error detection circuit, and the first and second memory portions are reset if an error is detected by the slow reset circuit; and operational circuitry configured to use the information stored in at least one of the first or second memory portions.

BRIEF DESCRIPTION OF THE DRAWINGS

The invention may be more completely understood in consideration of the following detailed description of various embodiments of the invention in connection with the accompanying drawings, in which.

Figure 1:
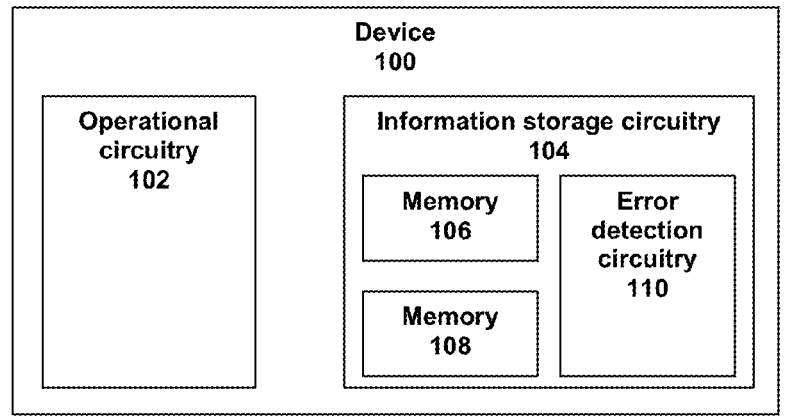
FIG. 1 is a block diagram of a device comprising information storage circuitry according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to reliably storing information in a sensor or other device. In an embodiment, information storage circuitry comprises independent, redundant memory portions and error detection circuitry. The circuit can operate in cooperation with a memory writing procedure that utilizes a validity bit and sequentially writes to one or the other of the redundant memory portions such that at least one of the memory portions has data which is valid and can be recognized as such.

Referring to FIG. 1, a block diagram of a device 100 is depicted. In general, device 100 is a functional device having operational circuitry 102 for carrying out its function(s). Operational circuitry 102 can comprise a microcontroller and other circuitry necessary for device 100 to generally operate. For example, device 100 can comprise a sensor in embodiments, such as a magnetic field sensor, current sensor, temperature sensor, acceleration sensor, or some other type of sensor, wherein operational circuitry 102 comprises sensor circuitry. In other embodiments, device 100 can comprise some other device, such as a voltage regulator; transducer, such as magnetic or pressure; signal path; digital control; output driver; or other parts of an integrated circuit device. For convenience herein, device 100 will be discussed in the context of a magnetic field sensor device, though this discussion is not to be considered limiting or limited to magnetic field sensor devices.

Device 100 also comprises information storage circuitry 104. Information storage circuitry 104 can be used within device 100 to store information utilized by operational circuitry 102 during operation, such as calibration data, output values or other information. In embodiments, circuitry 104 also can be used to verify whether information stored therein is valid. For example, some magnetic field sensor devices store calibration information during operation, and that information can be used by operational circuitry 102 if device 100 is reset, restarted, experiences a power spike or disruption or if some other event occurs affecting regular operation of device 100. Using that stored information can enable a faster restart and more accurate and reliable operation in embodiments, rather than using default information or waiting to acquire new information, which in embodiments may not be possible if the information is required in order to properly start up. If that stored information is not valid, however, because it was being written to memory 106 or 108 when a loss of power or other event occurred, or for some other reason, additional errors can occur within device 100. Therefore, information storage circuitry 104 also can verify whether the stored information is valid before it is used by operational circuitry 102.

In embodiments, information storage circuitry 104 comprises redundant memory portions 106 and 108 and error detection circuitry 110. Memory portions 106 and 108 can one or more comprise latches, registers or other suitable memory circuitry in embodiments. Error detection circuitry 110 comprises reset circuitry that enables a determination of whether a loss of power event has exceeded a maximum time such that a minimum necessary voltage required for information to be reliably stored in memory portions 106 and 108 has dissipated. If the information stored in memory portions 106 and 108 can no longer be considered to be reliable because the voltage level has fallen too far, the reset circuitry can reset memory portions 106 and 108.

Figure 2:
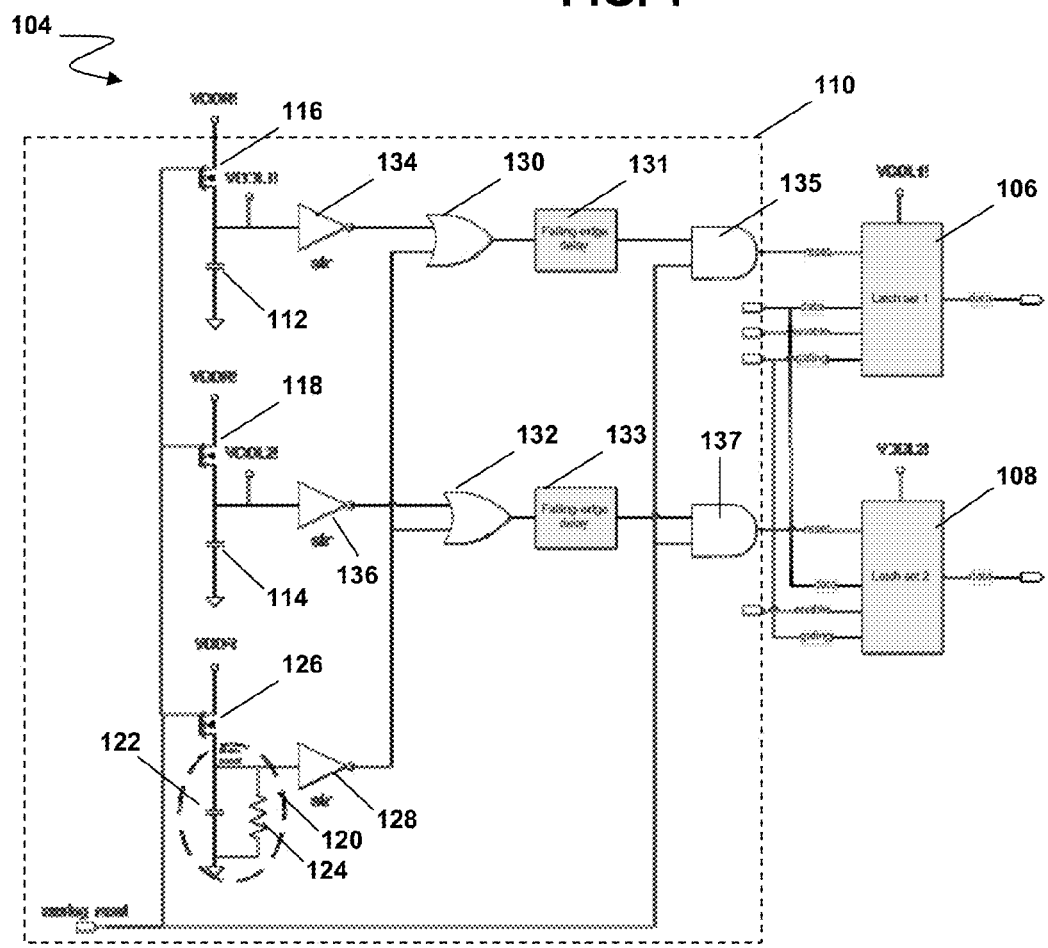
FIG. 2 is a circuit block diagram of the information storage circuitry of FIG. 1.

Referring to FIG. 2, an embodiment of information storage circuitry 104 is depicted in more detail. In the embodiment of FIG. 2, each memory portion 106 and 108 comprises a set of latches, which are depicted in more detail in FIG. 4 and will be discussed below. Each memory portion 106 and 108 is coupled to its own voltage supply domain, VDDL1 and VDDL2, respectively. The voltage at VDDL1 and VDD2 can vary in embodiments, such as according to an application. For example, VDDL1 and VDDL2 can be about 2.5 V to about 3.5 V in embodiments, with external supply voltages being about 3.5 V, about 12 V, about 48 V, or some other voltage level in other embodiments. Each supply domain VDDL1 and VDDL2 comprises a capacitor 112 and 114, respectively, used to store energy and supply power to its respective memory portion 106 and 108 during short power-downs or other losses of power to device 100. In one embodiment, each capacitor 112 and 114 comprises a 60 pF integrated capacitor, though the size of capacitors 112 and 114 can vary in other embodiments. Larger capacitors 112 and 114, for example, would generally increase storage times during losses of power and therefore can vary in embodiments, though larger capacitors will generally be more expensive in cost and area. Each supply domain VDDL1 and VDDL2 is also coupled to a regulated power supply VDDR by switches 116 and 118. In one embodiment, each switch 116 and 118 comprises a transistor, such as an nMOS transistor. Switches 116 and 118 are controlled by an analog reset of device 100. Thus, so long as VDDR is above the reset threshold, VDDL1 and VDDL2 are coupled to VDDR. If VDDR falls below the reset threshold, VDDL1 and VDDL2 will be disconnected from VDDR by switches 116 and 118 and supplied with power only via capacitors 112 and 114.

Figure 3:
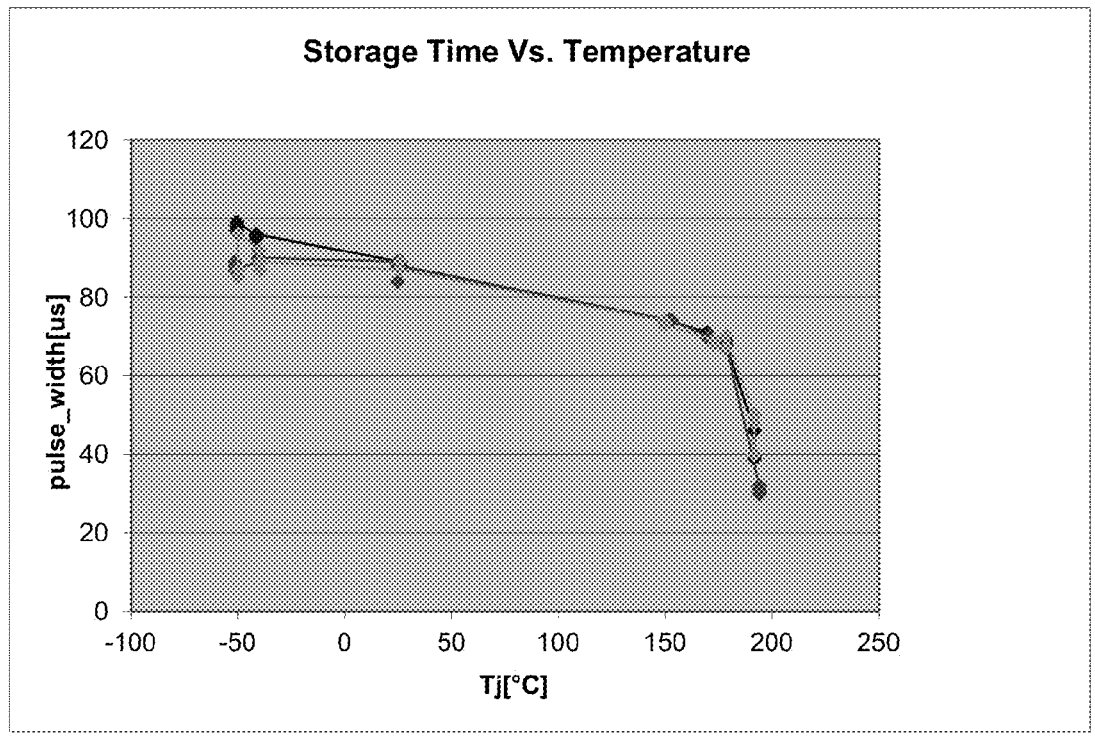
FIG. 3 is a plot of storage time versus temperature according to an embodiment.

When VDDL1 and VDDL2, and thus memory portions 106 and 108, respectively, are discharged via the leakage current of internal transistors, the time during which the information stored in memory portions 106 and 108 remains reliable decreases exponentially as temperature increases. Refer, for example, to FIG. 3, which is a graph of storage times versus temperature from one test implementation. As can be seen, the storage time, measured here in µ-seconds, decreases generally as temperature increases, and decreases rapidly beginning about 150 degrees C. Because it is desired to better monitor the length of time for which memory portions 106 and 108 are reliant on capacitors 112 and 114 for power in order to better determine whether stored information is reliable, and the temperature is difficult to control given the operating characteristics, environment and other factors affecting device 100, circuitry 104 also comprises a slow reset circuit 120. Slow reset circuit 120 comprises a capacitor 122 and a resistor 124 connected in parallel. In one embodiment, capacitor 122 is about 20 pF and resistor 124 is about 3 mega-Ohms (MΩ), though these values can vary in other embodiments. Resistor 124 functions as a discharge resistor, such that when capacitor 122 is disconnected from VDDR by a switch 126 coupled to the analog reset, capacitor 122 begins to discharge through resistor 124. The discharge time of resistor 124 is less variable with temperature than that of capacitors 112 and 114, such that the elapsed time can be better monitored according to the power that has been discharged from capacitor 122 by resistor 124. At the next start-up of device 100, a comparator 128, such as a Schmitt trigger, is used to sense the voltage level at capacitor 122 and compare that voltage to a threshold. If the voltage is below the threshold, such as about 1.0 to about 1.2 V in an embodiment, the time during which information can be reliably stored in memory portions 106 and 108 has been exceeded, and memory portions 106 and 108 are reset via OR gates 130 and 132, respectively, at the same time VDDL1 and VDDL2 are reconnected to VDDR. The reset pulse length is increased with the help of falling edge delays (discussed below with respect to an embodiment comprises falling edge delay circuits 131 and 133) so the reset signal is reliable. Capacitor 122 as well as capacitors 112 and 114 are then recharged. The voltage threshold used by comparator 128 can vary in other embodiments, being lower or higher based on technology, application and/or other components of circuitry 104.

In addition to being coupled to comparator 128, OR gates 130 and 132 are each also coupled to other comparator 134 and 136, respectively, each associated with one of memory portions 106 and 108. Comparators 134 and 136 also can be Schmitt triggers in embodiments. These comparators 134 and 136 can be viewed as implementing a fail safe mode, similarly to comparator 128: at the next start-up following a loss of power or other event, comparators 134 and 136 can be used to sense the voltage at VDDL1 and VDDL2, respectively, and if the voltage is below a threshold, memory portions 106 and 108 will be reset. Because OR gates 130 and 132 are each coupled to a comparators 134 or 136, respectively, and to comparator 128, a reset at either a respective memory portion 106 or 108 will reset that memory portion 106 or 108. A reset from slow reset circuit 120, as can be seen in FIG. 2, will reset both memory portions 106 and 108. AND gates 135 and 137 also are used as protection to avoid parasitic spikes that could be seen as reset signals to reset memory portions 106 or 108.

Circuitry 104 also comprises falling edge delay circuits 131 and 133 in an embodiment. In embodiments, circuits 131 and 133 can be used to generate a cleaner pulse shape though are optional. In embodiments, a reset pulse can be about 10 ns, which may not be enough to reliably trigger a reset. Circuits 131 and 133 lengthen the pulse, or delay the falling edge, such that a more reliable reset pulse is generated. For example, in an embodiment circuits 131 and 133 can increase the length of a reset pulse from about 10 ns to about 50 ns. AND gates 135 and 137 are respectively coupled between circuits 131 and 133 (or OR gates 130 and 132, respectively, in embodiments in which circuits 131 and 133 are omitted) as well as to an analog reset, such that a reset at either reset portion, that associated with memory portion 106 or that associated with memory portion 108, will trigger a reset of that memory portion 106 or 108 so long as the analog reset signal is low, as the analog reset from the chip reset functions as a gating signal, disabling any possible reset from comparators 134, 136 and/or 128 so long as it is low.

Figure 4:
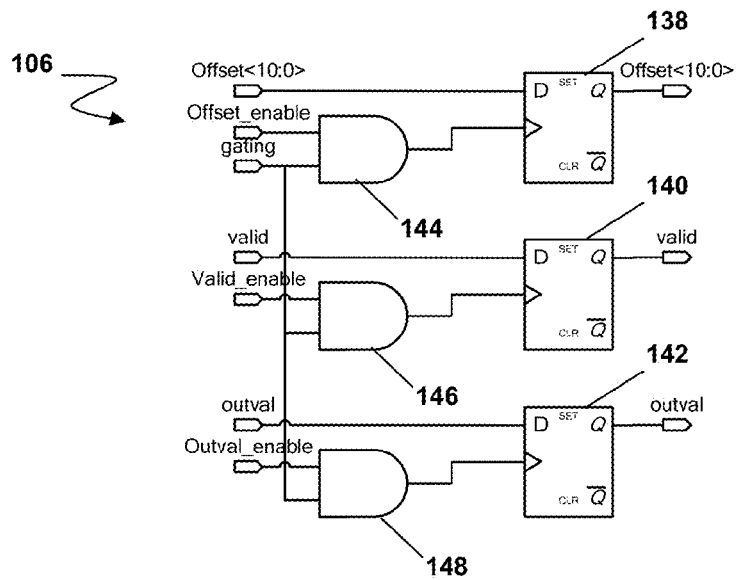
FIG. 4 is a block diagram of a memory portion of FIGS. 1 and 2.

Referring also to FIG. 4, one embodiment of a memory portion 106 is depicted. Though only memory portion 106 is depicted, in general memory portion 108 will be the same. In various embodiments, memory portions 106 and 108 generally will have the same structure as one another, though that structure can differ from what is depicted in the embodiment of FIG. 3. In FIG. 3, memory portion 106 comprises a set of three latches 138, 140 and 142. Latches 138 and 142 store information bits, and latch 140 stores an error detection or validity bit. The particular number, arrangement and data storage configuration of latches 138, 140 and 142 can vary in embodiments from that depicted as an example in FIG. 3. Latches 138, 140 and 142 can only be written to in an embodiment if the gating pin of each, which are coupled to each other as well as to the analog reset, is high. Each latch 138, 140 and 142 also comprises a write enable, depicted as Offset_enable, Valid enable and Outval_enable, respectively. The write enable and the gating pin of each latch 138, 140 and 142 are coupled to an AND gate 144, 146 and 148.

Figure 5:
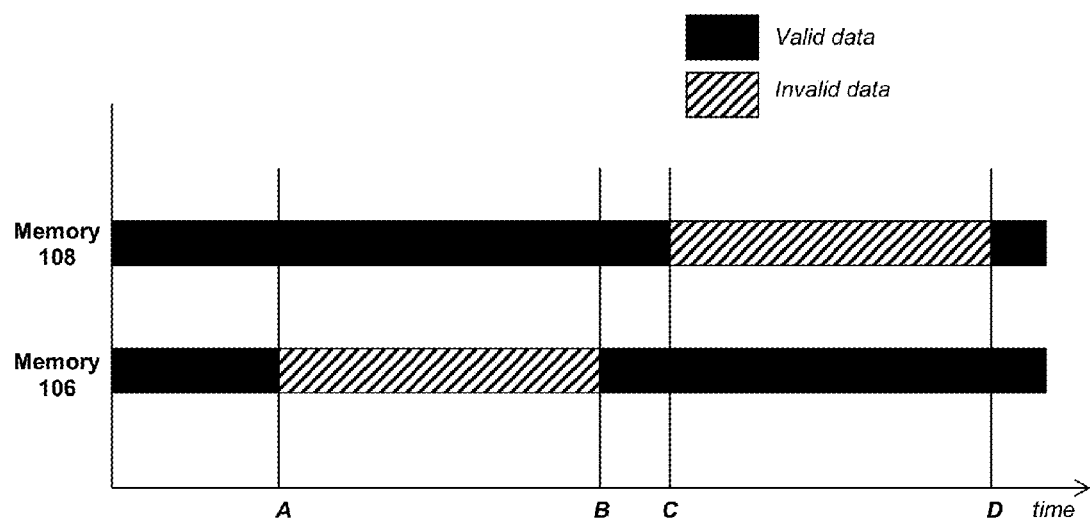
FIG. 5 is a write timing diagram according to an embodiment.
Figure 6:
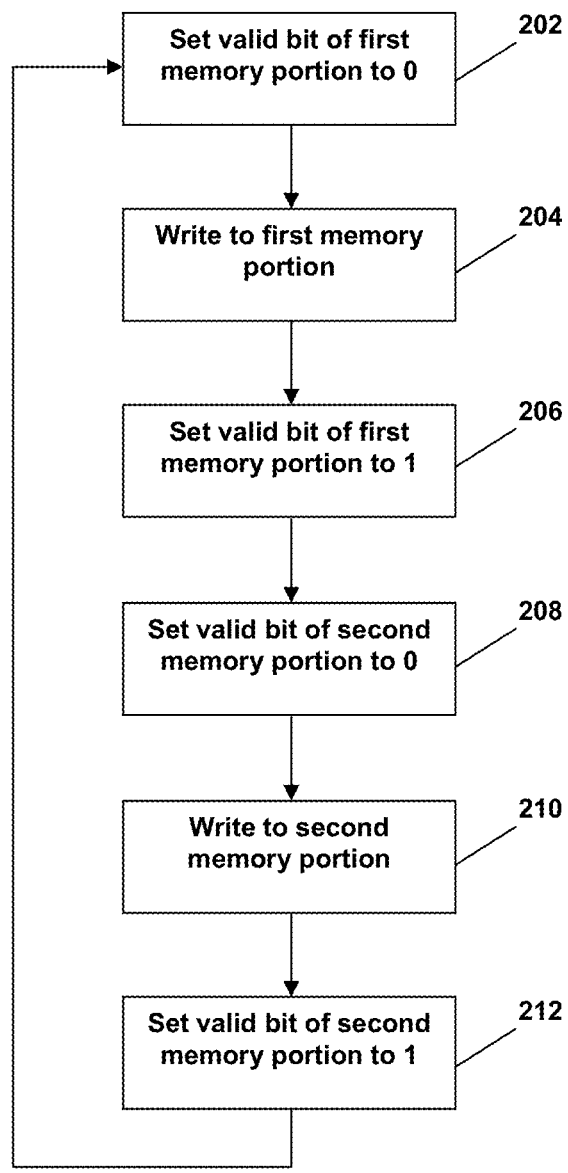
FIG. 6 is a flowchart of a write process according to an embodiment.

In embodiments, a unique write procedure is used with circuitry 104 in order to reliably write information to and store information in memory portions 106 and 108. The write procedure ensures that valid data is stored in at least one of the memory portions 106 and 108, available to device 100, even if a reset occurs during a write process to one or the other. Referring to FIGS. 5 and 6, at A (FIGS. 5) and 202 (FIG. 6) the validity bit of memory portion 106 is set to 0. Information is then written to memory portion 106 at 204, but the information is not valid until the writing is complete. At B and 206, the validity bit of memory portion 106 is set to 1, meaning a successful write was completed and the information stored in memory portion 106 is valid beginning at B. At C and 208, the validity bit of memory portion 108 is set to 0, and information is written to memory portion 108 at 210. The time elapsed between B and C is on the order of a few microseconds or less in embodiments, though this can vary in other embodiments. At D and 212, the validity bit of memory portion 108 is set to 1, meaning a successful write was completed and the information stored in memory portion 106 is valid beginning at D. The process then can repeat itself from 202.

Thus, valid data should always be present in at least one of the memory portions 106 and 108, identifiable as such by the validity bit of that memory portion. Information is written to only one memory portion 106 or 108 at a time, and if a loss of power or other interruption occurs during the write, the validity bit for that memory portion 106 or 108 will not be valid. It will either be a 0 or in a meta-stable state, neither a 0 nor a 1. In a meta-stable state, the internal nodes of latch 140 are between 0 and 1, which will cause capacitor 112 or 118 to discharge rapidly, triggering a reset by Schmitt trigger 134 or 136 at the next start up. If the validity bit is a 0, it will be checked at the next start-up by digital logic in device 100 and that memory portion 106 or 108 reset, and information from the other memory portion 106 or 108 will be used. This sequential writing procedure ensures that one of memory portions 106 or 108 will have valid data for use at the next start-up of device 100.

Embodiments thereby provide devices, integrated circuits, systems and methods for reliably storing information and for determining if information is no longer reliable because of elapsed time or for some other reason. Embodiments comprise redundant memory portions and utilize a unique writing procedure in order to ensure that valid data is present in at least one of the memory portions. Embodiments thereby provide consistent access to reliable information, enabling faster start-up, restart, calibration and other operations of devices.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An integrated circuit comprising:
a first memory portion configured to store information and a validity bit;
a second memory portion configured to store information and a validity bit; and
circuitry comprising a first error detection circuit coupled to the first memory portion, a second error detection circuit coupled to the second memory portion, and a slow reset circuit coupled to both the first and second memory portions, wherein the first memory portion is reset if an error is detected by the first error detection circuit, the second memory portion is reset if an error is detected by the second error detection circuit, and the first and second memory portions are reset if an error is detected by the slow reset circuit.

2. The integrated circuit of claim 1, wherein the error is an interruption of power.

3. The integrated circuit of claim 1, wherein the slow reset circuit comprises a capacitor coupled in parallel with a resistor.

4. The integrated circuit of claim 3, wherein the circuitry further comprises a comparator coupled to the slow reset circuit and configured to compare a voltage at the capacitor with a threshold, and wherein the error detected by the slow reset circuit is the voltage at the capacitor being less than the threshold.

5. The integrated circuit of claim 4, wherein the comparator comprises a Schmitt trigger.

6. The integrated circuit of claim 1, wherein each of the first error detection circuit and the second error detection circuit comprises a capacitor and a comparator, wherein the comparator is configured to compare a voltage at the capacitor with a threshold, and wherein the error detected by the first or second error detection circuit is the voltage being less than the threshold.

7. The integrated circuit of claim 1, wherein each of the first and second memory portions comprises a set of latches.

8. The integrated circuit of claim 7, wherein each set of latches is configured to store information and the validity bit.

9. The integrated circuit of claim 1, wherein the first and second memory portions are redundant.

10. The integrated circuit of claim 9, wherein data is written to the first and second memory portions sequentially, and wherein the validity bit of each of the first and second memory portions is set low when writing is taking place and is set high when the writing is complete.

11. The integrated circuit of claim 10, wherein the circuitry is configured to reset the corresponding first or second memory portion when the validity bit stored in that memory portion is not valid at start-up.

12. The integrated circuit of claim 1, further comprising first and second falling edge delay circuits coupled, respectively, between the first and second memory portions and the first and second error detection circuits and configured to delay a falling a edge of a reset pulse to reset the first or second memory portions.

13. A method comprising:
setting a validity bit of a first memory portion to a first value;
writing data to the first memory portion;
setting a validity bit of the first memory portion to a second value;
setting a validity bit of a second memory portion to a first value;
writing data to the second memory portion; and
setting a validity bit of the second memory portion to a second value.

14. The method of claim 13, further comprising:
checking the validity bits of the first and second memory portions; and
using the data from the first or second memory portion having the validity bit of the second value.

15. The method of claim 14, further comprising resetting the first or second memory portion if the first or second memory portion has a validity bit of other than the second value.

16. The method of claim 13, further comprising:
sensing a first voltage on a first capacitor;
comparing the first voltage with a first threshold; and
resetting the first and second memory portions if the first voltage is below the first threshold.

17. The method of claim 16, further comprising:
sensing a second voltage on a second capacitor coupled to the first memory portion;
comparing the second voltage with a second threshold;
resetting the first memory portion if the second voltage is below the second threshold;
sensing a third voltage on a third capacitor coupled to the second memory portion;
comparing the third voltage with a third threshold; and
resetting the second memory portion if the third voltage is below the third threshold.

18. A device comprising:
information storage circuitry comprising
a first memory portion configured to store information and a validity bit;
a second memory portion configured to store information and a validity bit; and
circuitry comprising a first error detection circuit coupled to the first memory portion, a second error detection circuit coupled to the second memory portion, and a slow reset circuit coupled to both the first and second memory portions, wherein the first memory portion is reset if an error is detected by the first error detection circuit, the second memory portion is reset if an error is detected by the second error detection circuit, and the first and second memory portions are reset if an error is detected by the slow reset circuit; and
operational circuitry configured to use the information stored in at least one of the first or second memory portions.

19. The device of claim 18, wherein the device comprises a sensor.

20. The device of claim 19, wherein the information comprises calibration information.

21. The device of claim 18, wherein the device comprises a semiconductor device, and the information comprises data.

* * * * *